United States Patent [19]

Cerato et al.

[11] Patent Number: 5,047,675
[45] Date of Patent: Sep. 10, 1991

[54] CIRCUIT DEVICE, MADE UP OF A REDUCED NUMBER OF COMPONENTS, FOR SIMULTANEOUSLY TURNING ON A PLURALITY OF POWER TRANSISTORS

[75] Inventors: Sandro Cerato, Vercelli; Antonella Baiocchi, Pavia; Angelo Alzati, Milan, all of Italy

[73] Assignee: SGS-Thomson Microelectronics S.r.L., Milan, Italy

[21] Appl. No.: 425,423

[22] Filed: Oct. 23, 1989

[30] Foreign Application Priority Data

Nov. 7, 1988 [IT] Italy ................. 22533 A/88

[51] Int. Cl.$^5$ ................. H03K 17/687; H03K 19/01
[52] U.S. Cl. ................. 307/578; 307/450; 307/453; 307/482; 307/270
[58] Field of Search ............ 307/482, 578, 270, 450, 307/453

[56] References Cited

U.S. PATENT DOCUMENTS

| | | |
|---|---|---|
| 3,805,095 | 4/1974 | Lee et al. ................. 307/578 |
| 4,110,637 | 8/1978 | Rusznyak ................. 307/578 |
| 4,633,106 | 12/1986 | Backes et al. ................. 307/578 |
| 4,673,829 | 6/1987 | Gupta ................. 307/578 |

Primary Examiner—Stanley D. Miller
Assistant Examiner—Margaret Rose Wambach
Attorney, Agent, or Firm—Rosen, Dainow & Jacobs

[57] ABSTRACT

A circuit device, made up of a reduced number of components, for simultaneously turning on a plurality of power transistors, being of a type adapted to be connected between the output of an oscillator and the bootstrap input of a turn-on circuit which are both incorporated into an integrated circuit also incorporating said transistors, further comprises:

a first capacitor having one end connected to the oscillator output and the other end connected to the bootstrap input via a diode, a second capacitor connected between the bootstraps input and one voltage supply pole, and a second diode connected between the junction of the first capacitor and the diode, and the voltage supply pole.

6 Claims, 1 Drawing Sheet

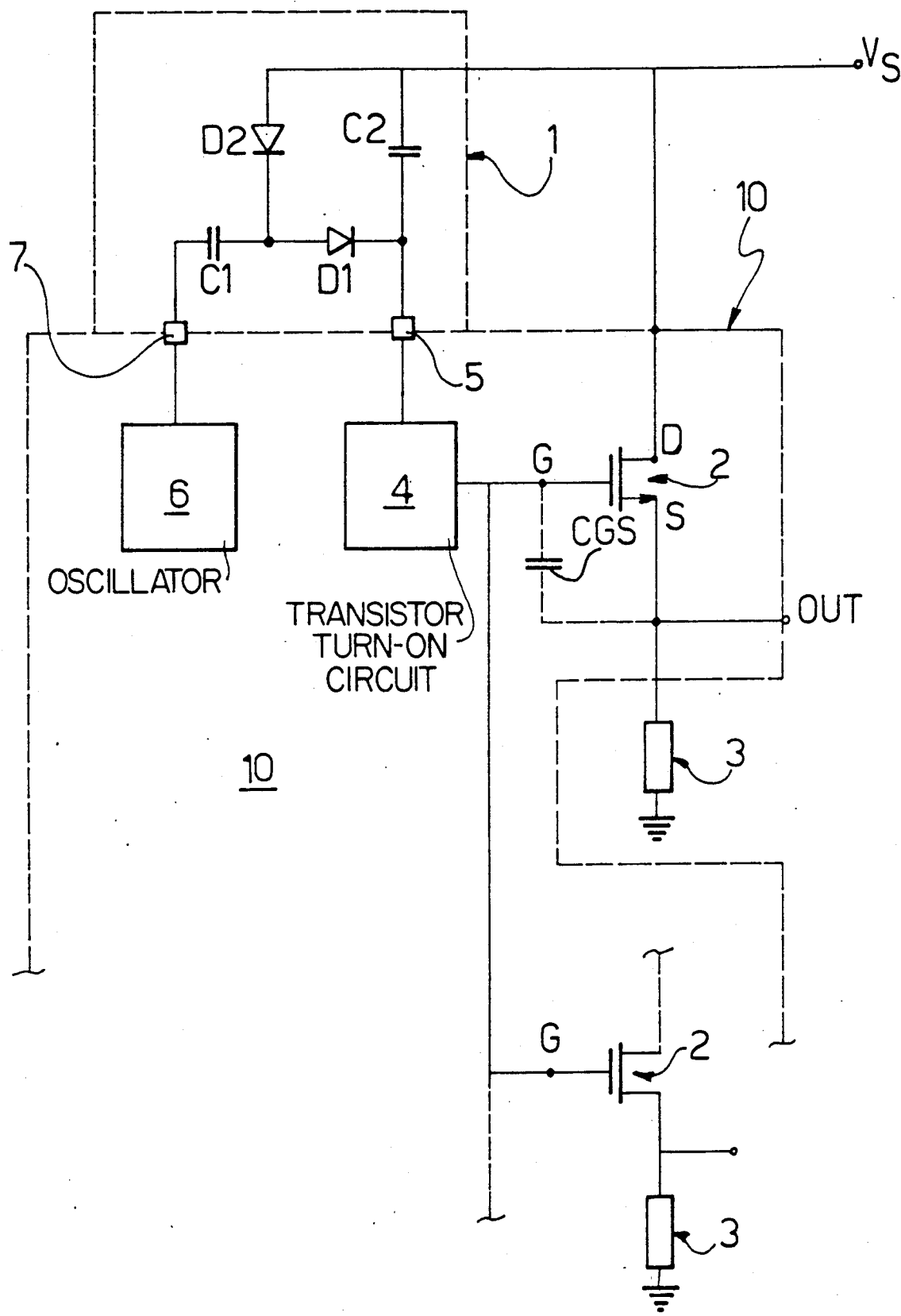

CIRCUIT DEVICE, MADE UP OF A REDUCED NUMBER OF COMPONENTS, FOR SIMULTANEOUSLY TURNING ON A PLURALITY OF POWER TRANSISTORS

DESCRIPTION

This invention relates to a circuit device, made up of a reduced number of components, for simultaneously turning on a plurality of power transistors, being of a type adapted for connection between the output of an oscillator and the bootstrap input of a turn-on circuit which are both incorporated into integrated circuit.

BACKGROUND OF INVENTION

As is well known, power transistors are widely employed nowadays for driving electric loads. For this purpose, in some circuits, they are connected between a power supply source and the electric load with the gate, in the instance of MOS transistors, or the base, in the instance of bipolar transistors, connected to a control circuit In particular, power transistors of the DMOS type are employed in the so-called high-side-driver configuration to drive inductive electric loads. Such DMOS transistors are also used in bridge circuits, e.g. to control one phase of a stepper motor. DMOS transistors are double-diffused power transistors of the type disclosed in, for example, IEEE Transactions on Electron Devices, Vol. ED-27, No. 2, February 1980, pages 356-367.

In applications like this, a DMOS power transistor is also to transfer the supply voltage value Vs to the load with almost nil voltage drop between the drain and source electrodes. This operating condition, under which the transistor will deliver maximum current, is the same as having a voltage drop Vgs of about ten volts between the gate and source electrodes.

Between the gate and the source of the DMOS transistor is an inherent capacitance Cgs, and the above-mentioned operating condition is achieved in practice by charging this capacitance to ten volts, thereby the gate electrode is brought up to a voltage exceeding by ten volts that of the supply pole Vs.

To accomplish this, the prior art provides a first, so-called charge pump solution which consists of charging said inherent capacitance Cgs by capacitive division.

In basic terms, an additional capacitance C is connected between the transistor gate and an oscillator arranged to supply a voltage which varies between zero and the value of the supply voltage Vs. During one half-cycle of the oscillator, the capacitance C is charged at a predetermined voltage value Vc, and during the following half-cycle of the oscillator, this will charge the inherent capacitance Cgs.

This prior circuit arrangement, while serving its purpose, still has the drawback of being inherently slow-acting, because it requires several half-cycles of the oscillator to charge the inherent capacitance.

A second prior technical solution consists instead of connecting the integrated circuit incorporating the DMOS transistor to an external component, specifically a bootstrap capacitance for each DMOS transistor. This would lead to using an external capacitance for each power transistor integrated to the circuit, which is, of course, a cost-intensive practice.

A third prior technical solution provides for an additional supply line at a voltage level which is by ten volts higher than the supply voltage Vs, as well as an external buffer capacitance which is charged from the additional capacitance C associated with the oscillator, in a similar manner to that described in connection with the first-mentioned charge pump approach.

This, the third, prior solution, while being beneficial in that it allows connection of plural high-side-driver DMOS transistors to one side of the buffer capacitance, has a limitation in that the size of that external capacitance cannot be increased beyond a finite maximum if the additional capacitance C is to keep constantly charged. This poses practical limitations to the number of the transistors that can be made to conduct at any one time through the external capacitance or, in an equivalent way, on the turning-on rate.

BRIEF SUMMARY OF INVENTION

The technical problem that underlies this invention is to provide a circuit device which has such structural and performance characteristics as to permit a plurality of power transistors to be driven simultaneously to the "on" state, under a condition of maximum delivery to the load, using a uniquely reduced number of components to overcome the cited drawbacks with which the prior art is beset.

This problem is solved by a circuit device as indicated being characterized in that it comprises:

a first capacitor having one end connected to the output and the other end connected to said input via a first diode, a second capacitor connected between said input and one voltage supply pole, and a second diode connected between the first capacitor and the first diode and the voltage supply pole.

The features and advantages of a circuit according to the invention will become apparent from the following detailed description of an exemplary embodiment thereof, given by way of illustration and not of limitation with reference to the accompanying drawing.

SUMMARY OF DRAWINGS

The drawing figure shows the circuit of this invention in wiring diagram form.

DETAILED DESCRIPTION OF PREFERRED EMBODIMENTS

With reference to the drawing figure, generally and diagrammatically indicated at 1 is a circuit device, made up of a reduced number of components, for simultaneously turning on a plurality of power transistors 2. In particular, in the embodiment under consideration, such transistors 2 would be of the DMOS type with corresponding drain D and source S electrodes connected to a positive voltage supply pole Vs and an electric load 3 to be driven.

The transistors 2 are incorporated into an integrated circuit 10 which also comprises a turn-on circuit 4 and an oscillator 6 operative to supply at its output, at a pin 7, a voltage value varying between zero and a predetermined value Vr.

The gate electrode G of the transistor 2 is connected to the output of the turn-on circuit 4 which has its input connected to a bootstrap pin 5 of the integrated circuit 10 including the transistors 2.

Between the gate G and the source S of each transistor 2 is an inherent capacitance Cgs to be charged to a predetermined voltage value through the device 1 and the turn-on circuit 4.

The device 1 is in essence a charge pump circuit adapted for connection between the pin 7, connected to the output of the oscillator 6, and said bootstrap pin 5.

This device 1 comprises a capacitor C1, the first capacitor, having one end connected to the pin 7 and the other end connected to the pin 5 via a diode D1, the first diode, forward biased to said capacitor C1.

A second capacity C2 is connected between the bootstrap pin 5 and the supply pole Vs, whilst a second diode D2 has one end connected between said capacitor C1 and the diode D1, and the other end connected to the pole Vs. This diode D2 is forward biased to said pole.

The capacitor C1 is pre-charged to a voltage equal to the difference between the supply voltage Vs and the voltage drop across the diode D2.

As a result, a voltage will appear at the bootstrap pin 5 which is equal to $Vs+Vr-2*Vdiode$.

It will be sufficient, therefore, to provide the integrated circuit 10 with a low-voltage oscillator, e.g. between zero and twelve volts, representing Vr, to thereby ensure, at the gate G of the DMOS power transistors, a voltage value which exceeds the supply by ten volts. In fact, the voltage drop across the diodes D1 and D2 has a combined value of two volts, thereby to ensure proper operation of the device, it will suffice for the oscillator 6 to supply a voltage of about twelve volts.

The circuit device according to the invention allows for the use of a reduced number of components with attendant savings in silicon area over conventional circuits.

Another advantage is the reduced number of the pins involved in the connection between this device and the integrated circuit incorporating the power transistors.

The circuit device of this invention is therefore particularly economical both in terms of the components used and of the area occupied on the integrated circuit.

I claim:

1. A circuit device, made up of a reduce number of components, for simultaneously turning on a plurality of power transistors, and being of a type adapted for connection between the output of an oscillator and the bootstrap input of a turn-on circuit, said oscillator and turn-on circuit and power transistors being incorporated into an integrated circuit, characterized in that said circuit device comprises:

a first diode,
a first capacitor having one end connected to said oscillator output and its other end connected in series with said first diode to said bootstrap input of the turn-on circuit,
a second capacitor connected between said bootstrap input of the turn-on circuit and one voltage supply pole, and
a second diode connected between the junction of the first capacitor and the first diode, and directly to said one voltage supply pole.

2. A device according to claim 1, characterized in that said power transistors are of the DMOS type.

3. A device according to claim 1, characterized in that said second diode is forward biased with respect to said voltage supply pole.

4. A device according to claim 1, characterized in that said first diode is forward biased with respect to the first capacitor.

5. The combination of a plurality of power transistors having input terminals, an oscillator having an output, a turn-on circuit having a bootstrap input and out output connected to the transistor input terminals, and a circuit device, made up on reduced number of components, for simultaneously turning on said power transistors and connected between the output of said oscillator and the bootstrap input of said turn-on circuit, said oscillator and turn-on circuit and power transistors being incorporated into an integrated circuit, characterized in that said circuit device comprises:

a first diode,
a first capacitor having one end connected to said oscillator output and its other end connected in series with said first diode to said bootstrap input of the turn-on circuit,
a second capacitor connected between said bootstrap input of the turn-on circuit and the high side pole of a voltage supply, and
a second diode connected between the junction of the first capacitor and the first diode, and directly to said high side voltage supply pole.

6. The combination of claim 5, wherein said power transistors are DMOS transistors, said transistor input terminals are its gate electrodes, and a load for each of the transistors connected between a source electrode of a transistor and ground, the transistor drain electrode being connected directly to the said high side pole of the voltage supply.

* * * * *